United States Patent [19]

Miyazato

[11] Patent Number: 5,328,752
[45] Date of Patent: Jul. 12, 1994

[54] SUBSTRATE FOR PRINTED CIRCUIT BOARDS USING PHOTOCURABLE RESIN AND PROCESS FOR PRODUCING THE SAME

[75] Inventor: Keita Miyazato, Fukushima, Japan

[73] Assignee: Nitto Boseki Co., Ltd., Fukushima, Japan

[21] Appl. No.: 948,334

[22] Filed: Sep. 21, 1992

Related U.S. Application Data

[63] Continuation-in-part of Ser. No. 700,716, May 15, 1991, abandoned.

[30] Foreign Application Priority Data

May 15, 1990 [JP] Japan ................................ 2-124698

[51] Int. Cl.⁵ .............................................. B32B 9/00
[52] U.S. Cl. .................................... 428/209; 428/901; 430/308
[58] Field of Search ................ 430/308; 428/209, 901

[56] References Cited

U.S. PATENT DOCUMENTS

| | | | |
|---|---|---|---|
| 4,216,287 | 8/1980 | Sano et al. | 430/308 |
| 4,288,529 | 9/1981 | Sano et al. | 430/308 |
| 4,506,004 | 3/1985 | Sullivan | 430/312 |
| 4,849,321 | 7/1989 | Hung et al. | 428/209 |

Primary Examiner—Patrick J. Ryan
Assistant Examiner—Kam F. Lee
Attorney, Agent, or Firm—Darby & Darby

[57] ABSTRACT

The instant invention discloses a process for producing a substrate for use in printed circuit which comprises: a vessel for containing a photo-curable resin; a masking means positioned above and in close proximity to the resin surface; a planar light for irradiating through the mask a thin layer of the photo-curable resin, means for moving the thin-layered cured product in the vertical direction, means for coating additional uncured resin on the cured product and irradiating the same to form a newly formed thin-layered cured product thereon, and means for successively coating and forming additional thin-layers of cured products. The second aspect of this invention relates to a substrate for use in printed circuit boards produced by the above-mentioned process and apparatus.

8 Claims, 3 Drawing Sheets

SUBSTRATE FOR PRINTED CIRCUIT BOARDS USING PHOTOCURABLE RESIN AND PROCESS FOR PRODUCING THE SAME

This is a continuation-in-part of application Ser. No. 07/700,716, filed May 15, 1991, now abandoned.

BACKGROUND OF THE INVENTION

1. Field of Invention

This invention relates to a substrate for use in printed circuit boards, and more particularly to a novel process for producing the substrate.

2. Related Art

Today, printed circuit boards are used in many fields such as computers, communication devices, domestic appliances, as a baseboard for receiving IC and LSI. As the substrate for such printed circuit boards, laminated boards are used. They comprise a woven fabric of glass fiber or paper or the like reinforcing material saturated with a matrix of epoxy resin, polyester resin, phenolic resin or polyimide resin. However, printed circuit boards using these laminates as substrate are disadvantageous because combining the starting woven glass fiber fabric with the matrix resin to form finish a printed circuit board capable of receiving IC or LSI is a very long and tedious process. For example, in the case of a printed circuit board made of a woven glass fiber fabric and epoxy resin, the woven fabric is first impregnated with epoxy resin and dried to prepare a preimpregnated sheet. In the next step, the desired number of preimpregnated sheets are laminated and a copper foil or the like superposed thereon. The whole construction is then hot-pressed to prepare the laminate board. Thereafter, a resist is formed and the board is etched to form the circuit, after which holes are drilled to receive the IC or VLI.

In addition to producing a printed circuit board using a laminate board, it has also been proposed to make printed circuit board by injection molding.

In the latter process, a thermoplastic resin is used as the matrix resin, and a previously formed circuit is transferred onto a transfer sheet simultaneously with the injection molding, whereby a circuit is formed on the molded product during the molding step.

According to the process of the invention, printed circuit boards can be obtained which may be not only planar, but also steric in shape. Although printed circuit boards prepared in this manner are limited in use because of the performance of the board itself and the limitations on the formable circuit patterns, this process has an important advantage in that the production cycle can be significantly shortened. Thus, this process may be adopted in new products in the continually expanding fields in which printed circuit boards are used.

On the other hand, photosteric lithography has been proposed as a method for making formed products of plastics, although not for printed circuit boards. For example, this process has been proposed in Japanese Patent Application Kokai (Laid Open) No. 62-101408, Japanese Patent Application Kokai (Laid-Open) No. 63-251227, Japanese Patent Publication No. 63-40650, etc. According to this process, a photo-curable resin is introduced into a vessel, and the resin surface is irradiated with a laser beam to cure the resin as desired. After shifting the resin surface, the laser beam is again projected to form a cured resin layer over the previously cured resin layer. By repeating this procedure, while altering the pattern of the projected laser beam, products having a variety of steric shapes can be obtained.

The pattern to be projected may be designed by CAD and the desired steric image cut by the laser beam into the thin layers. A personal computer or the like can guide a projecting part and the resin-container so as to automatically move and trace the thin-layered patterns to be cut. A laser beam is the type of beam considered most suitable for the purpose because of its high energy level and low convergence. As a modification of the above-mentioned photosteric modelling process, a planar ray, such as an ultraviolet ray, may be projected through a film mask.

As has been mentioned above, the conventional process for obtaining printed circuit board by the use of a laminated board requires long and tedious procedures, and therefore cannot be quickly modified for small production runs and for responding to the rapidly changing needs of consumer products.

On the other hand, the process by injection molding is very time consuming and costly for designing and making the die. Further, since it necessitates the use of a die, it is unsuitable for many kinds of small quantity production projects.

SUMMARY OF THE INVENTION

The object of this invention is to provide a new substrate and a process for producing said substrate for use in printed circuit boards suitable for making small quantity production items and which can be quickly modified to fill orders from consumers.

Another object of this invention is to provide a substrate for use in printed circuit boards having through-holes formed in the desired shape depending on the intended use in addition to vertically formed through-holes.

DETAILED DESCRIPTION OF PREFERRED EMBODIMENTS

Figure 1:
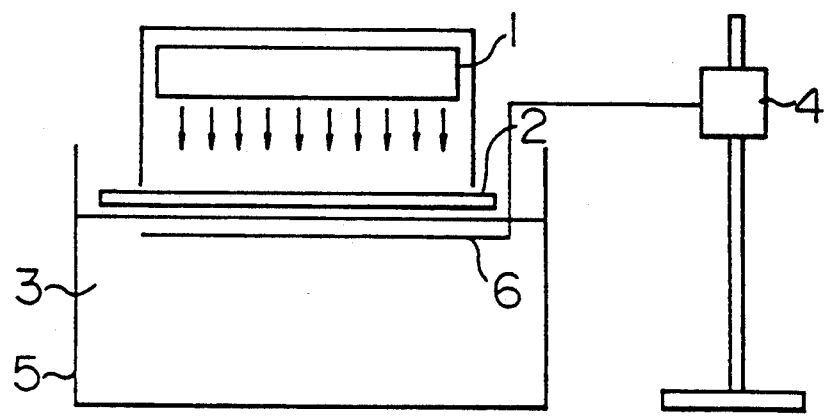
FIG. 1 is a schematic view of an apparatus used for the production process of this invention using a light source.

The first aspect of this invention relates to a process and apparatus for producing a substrate for use in printed circuit boards which comprises: a vessel for containing a photo-curable resin; a film mask positioned above and in close proximity to the resin surface; a planar light for irradiating through the masking means a thin layer of the photo-curable resin, means for moving the thin-layered cured product in the vertical direction, means for coating additional uncured resin on the cured product and irradiating the same to form a newly formed thin-layered cured product thereon, and means for successively coating and forming additional thin-layers of cured products. The second aspect of this invention relates to a substrate for use in printed circuit boards produced by the above-mentioned process and apparatus. That is, the second aspect of the present invention is to provide a substrate for use in a printed circuit board comprising a laminate of thin-layered cured products having holes formed at the predetermined positions: said cured products being produced by introducing a photo-curable resin into a vessel; providing a masking means above and proximate to the resin surface; irradiating planar light through the masking means to cure the exposed part of said photo-curable resin to form a thin-layer of cured product; shifting the cured product in the vertical direction and coating the same with additional photo-curable resin; irradiating planar light onto the additional photo-curable resin to form a newly cured thin-layer, and successively repeating the procedures of shifting, coating and curing.

The term "planar light" in the present specification means a light capable of irradiating almost evenly a surface having a predetermined area when said light is emitted from a light source as a parallel light.

As the photo-curable resin of this invention, a variety of resins curable by radiation can be used. For example, modified urethane methacrylate, oligo ester acrylate, urethane acrylate, epoxy acrylate, imide and aminoalkyd polymers can be used. The recently developed UV-curable resin prepared from diarylidene pentaerythritol is a preferred starting material (Spilac manufactured by Showa Kobunshi K.K.). Into these resins, fillers such as calcium carbonate, siliceous sand and milled glass fiber may be incorporated. The thin layer of resin which is exposed in accordance with the invention is generally from 30 to 100 microns thick.

A variety of light sources such as visible light and ultraviolet rays can be used depending on the type of photo-curable resin. It is preferable to use a collimated parallel light having a broad width so as to eliminate interference. The thin layer of resin is exposed, depending on the thickness and the resin formulation, for about 10 to 30 seconds.

As the masking means, there may be employed a masking film and a light source. The light source here is a an aggregate of pixel elements which can freely change between light transmitting state and non-transmitting state based on external instructions and is usually driven by microcomputer or the like.

An example of the production process of this invention will be explained with reference to FIG. 1. In FIG. 1, (1) is provided a UV light source, (2) is a light source (3) is the photo-curable resin, (4) is a position controller for cured product, (5) is a vessel, and (6) is a cured product holding plate. Cured product holding plate (6) is positioned in the photo-curable resin (3) contained in the vessel (5), in close proximity to the resin surface. The light source (2) is fixed at a position just above the resin surface, proximate to the surface. A planar UV light is projected from above the light source, whereby the exposed portion of the resin above the holding plate is irradiated by the UV light and cured in regions which correspond to the pattern on the masking means. After continuing the irradiation and curing for the necessary period of time, the position controller (4) is shifted slightly downward, whereby the cured product formed on the holding plate (6) is covered with a layer of uncured resin. Then, this uncured resin is UV-irradiated in accordance with the same or another pattern, and its irradiated parts cured. A masking film can be used in place of the light source.

Figure 2:
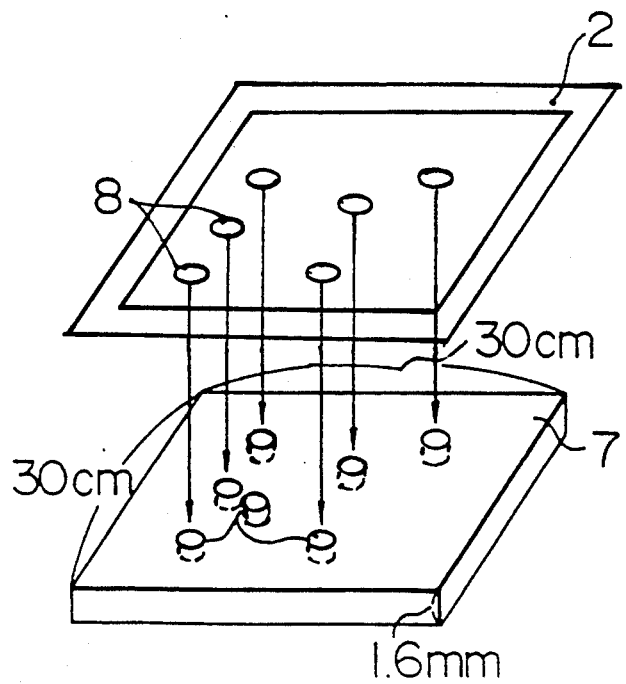
FIG. 2 schematically shows the substrate for printed circuit boards in connection with the light source in FIG. 1.

By successively repeating the exposure and curing process, a laminate of thin-layered cured product is formed on the holding plate (6). The planar shape of this laminate conforms to the pattern pictured on the light source. FIG. 2(7) is one example of a substrate for printed circuit boards of this invention. Its shape is determined according to the pattern pictured on light source (2). The pattern pictured thereon is a 30 cm square with a small circular masked part (8). As a result, the molded product is a 30 cm square substrate for printed circuit boards with a small circular hole (9).

By adjusting the holes to the necessary positions on the light source with reference to the circuit plan, it is not necessary to drill the holes in the substrate. The substrate thus obtained may be formed into a printed circuit board by forming a circuit thereon by an additive method, such as electroless plating.

After irradiation for a given period of time, the thin-layered cured product is shifted relatively in vertical direction and then, the pattern of light source is altered to (9). (9) is shifted only in the portion (9)-(a). This is successively carried out simultaneously with relative shifting of the thin layered cured product in vertical direction.

Figure 3:
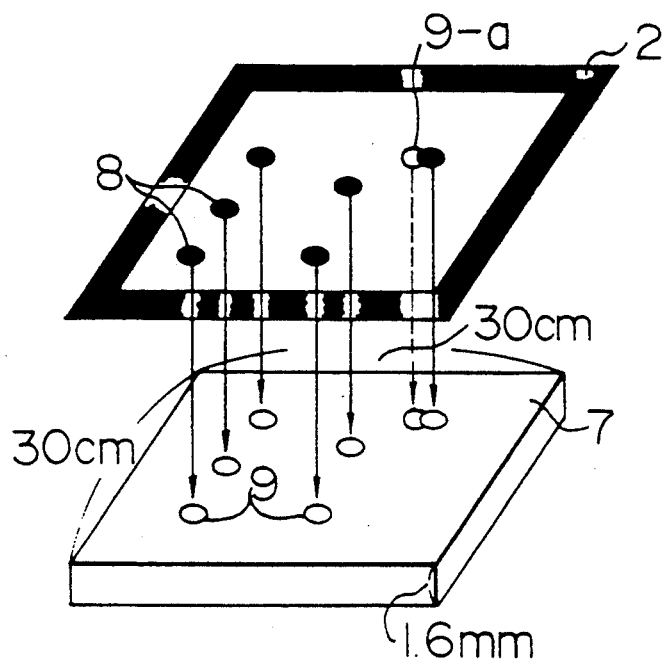
FIG. 3 schematically shows the substrate of this invention for printed circuit boards which shifts in relative position between the upper portion and the lower portion thereof in order that one of the through-holes can have a shape other than vertical depending on the use.
Figure 4:
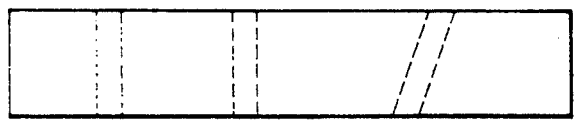
FIG. 4 is a perspective sectional view which schematically shows the shape of the through-holes in the substrate shown is FIG. 3.
Figure 5:
FIG. 5 is a perspective sectional view which schematically shows the shape of the through-holes in the substrate of one example of the substrate for printed circuit boards of this invention.

The resulting molded product is, for example, a square plate of 30 cm×30 cm having holes of small circle as shown in FIGS. 3 and 4 formed in conformity with the desired shape previously memorized in microcomputer. In this way, substrates having though-holes for use in printed circuit boards can be easily obtained.

Figure 6:
FIG. 6 is a perspective sectional view which schematically shows the shape of the through-holes in the substrate of another example of the substrate for printed circuit boards of this invention.
Figure 7:
FIG. 7 is a perspective sectional view which schematically shows the shape of the through-holes in the substrate of still another example of the substrate for printed circuit boards of this invention.

By changing the pattern of light source by variously changing the shapes memorized in computer, it is also possible to obtain substrates having through-holes as shown in FIGS. 6 and 7 for use in printed circuit boards. That is, according to the method of this invention, substrates having inclined through-holes can be obtained relatively simply and in a short time. Accordingly, substrates for use in printed circuit boards can be obtained by masking the desired positions of the through-holes shown in a circuit design drawing using masking means without formation of holes by drilling. Circuits are formed on the thus obtained substrates by additive methods such as electroless plating in conventional manner whereby printed circuit boards are obtained.

When a planar light is used in photosteric modelling method to produce molded products having very complicated steric shape with masking films, many masking films may be needed. Thus, in such a case, a light source can be used. That is, the desired printed circuit boards can be obtained by very simple method and apparatuses and in a shorter time as compared with usual methods for making printed circuit boards. Moreover, as compared with the method for making printed circuit boards by injection molding using the transfer process, the method of this invention is suitable for production of many kinds of small quantity production.

It has been said that photosteric modelling method using laser beams is not suitable for making formed products of large area because irradiation with laser beam which is dot irradiation requires too long time.

A photo-sterolithographic modeling process using planar light with the film mask as a masking means is considered unsuitable for molded articles having a complicated steric shape because it would require a large number of film masks. On the other hand, where the printed circuit has holes in the vertical direction, such as those which can be manufactured in accordance with this invention, only one film mask is needed. The procedure and apparatus are very simple and the substrates can be made in a shorter period of time than with conventional production processes. Further, the process is suitable for making many kinds of small quantity production items as compared with conventional production processes, e.g., injection molding using the transfer method, because the inventive process requires the preparation of only one film mask.

A photo-sterolithographic modeling process using laser beams is unsuitable for molded articles of large area, because it is based on pinpoint irradiation and is therefore too time-consuming.

To further illustrate the invention, attention is directed to the following examples:

EXAMPLE 1

The apparatus used is similar to the one diagrammatically shown in FIG. 1, in which a film mask is used instead of a light source. It includes a high pressure mercury lamp 2 KW (80 W/cm) as the ultraviolet light source at a distance of irradiation of was 10 cm. A 50 micron layer of the photo-curable resin, Spilac T-502 (manufactured by Showa Kobunshi K.K.) is formed. A film mask having a masking pattern shown in FIG. 2 is fixed at a position about 2 mm above the resin surface and the resin is exposed for 15 seconds. The holding plate (6) was shifted downward at constant intervals of time and the above process repeated. Thus, there was obtained a 30 cm × 30 cm substrate for a printed circuit board (shown in FIG. 2 by the numeral (7)) having a thickness of 1.6 mm and 6 holes. The production time was about 20 minutes.

EXAMPLE 2

The procedure of Example 1 was repeated, except that Spilac T-510 was used as the photo-curable resin. The production of the substrate for use in printed circuit boards having a size of 30 cm × 30 cm and a thickness of 1.6 mm took about 15 minutes.

EXAMPLE 3

The apparatus used is diagrammatically shown in FIG. 1. It includes a high pressure mercury lamp 2 KW (80 W/cm) as the ultraviolet light source at a distance of irradiation of 10 cm. Spilad T-502 (manufactured by Showa Kohunshi K.K.) was used as a photo-curable resin and Data Display Panel (manufactured by Eiki Kogyo K.K.) used as a light source was fixed at a position about 2 mm above the resin surface. Under these conditions, the holding plate (6) was shifted downward at constant intervals of time to obtain a 30 cm × 30 cm substrate for a printed circuit board which had a thickness of 1.6 mm and 6 holes (as shown by (7) in FIG. 2). The production time was about 30 minutes.

EXAMPLE 4

The procedure of Example 3 was repeated, except that Spilac T-510 was used as the photo-curable resin. The production of the substrate for use in printed circuit boards which had a size of 30 cm × 30 cm and a thickness of 1.6 mm took about 20 minutes.

As compared with prior art processes, the process of the invention is characterized in that it is suitable for a variety of small quantity production items produced in a much shortened period from the time the order is received. The process can also produce large-area substrates for use in printed circuit boards by simple procedure and apparatus. Further, the substrate for use in printed circuit boards obtained according to this invention has an important advantage in that the required holes can be made during the molding process without a separate drilling or punching step.

This invention provides a substrate for printed circuit boards in which holes for through-holes can be formed in various directions besides the vertical direction to the plane and the path of the holes can be in the form of a straight line or a curved line. Therefore, when the circuits of both sides of the circuit board are connected, the connection can be attained at a minimum distance of connection and accordingly, circuit density on the surface of the circuit board is reduced and formation of the circuits become simple. Furthermore, when comparison is made at the same circuit density, the circuit board can be made smaller accordingly.

What is claimed is:

1. A substrate for use in a printed circuit board having holes in predetermined positions and which are arranged in a predetermined manner, said substrate being comprised solely of laminated thin layers made of a photocurable resin of the same material; said laminated thin layers each being produced by introducing a photo-curable resin into a vessel; providing a masking means above and proximate to the resin surface; irradiating planar light through the masking means to cure the exposed part of said photo-curable resin to form a first formed thin layer of cured resin; shifting the first formed thin layer in the vertical direction to a position which allows the photo-curable resin to cover the first formed thin layer; irradiating planar light through the masking means to cure the exposed part of said photo-curable resin covering the first formed layer to laminate another thin layer of said photo-curable resin onto the first formed thin layer, and successively repeating the procedures of shifting, covering and curing.

2. A substrate for use in printed circuit board according to claim 1, wherein at least one of the holes formed at the predetermined positions is not vertical to the substrate.

3. A substrate for use in printed circuit board according to claim 1, wherein at least one of the holes formed at the predetermined positions is not a straight-line form.

4. A substrate as in claim 1, wherein said holes are simultaneously formed when the substrate is produced.

5. A product by process, said product comprising a substrate for use in a printed circuit board having holes in predetermined positions and which are arranged in a predetermined manner, said substrate being comprised solely of laminated thin layers made of a photocurable resin of the same material; said process comprising the steps of producing the laminated thin layers each by introducing a photo-curable resin into a vessel; providing a masking means above and proximate to a surface of the resin; irradiating planar light through the masking means to cure the exposed part of said photo-curable resin to form a first formed thin layer of cured resin; shifting the first formed thin layer in the vertical direction to a position which allows the photo-curable resin to cover the first formed thin layer; irradiating planar light through the masking means to cure the exposed part of said photo-curable resin covering the first formed layer to laminate another thin layer of said photo-curable resin onto the first formed thin layer, and successively repeating the steps of shifting, covering and curing.

6. A product by process according to claim 5, wherein at least one of the holes formed at the predetermined positions is other than vertical to the substrate.

7. A product by process according to claim 5, wherein at least one of the holes formed at the predetermined positions has a configuration other than straight-line form.

8. A product by process according to claim 5, wherein said holes are simultaneously formed as the substrate is produced during the step of producing the laminated thin layers.

* * * * *